US006911870B2

(12) United States Patent
Gierkink et al.

(10) Patent No.: US 6,911,870 B2
(45) Date of Patent: Jun. 28, 2005

(54) QUADRATURE VOLTAGE CONTROLLED OSCILLATOR UTILIZING COMMON-MODE INDUCTIVE COUPLING

(75) Inventors: Sander L. Gierkink, Hoboken, NJ (US); Vito Boccuzzi, Lebanon, NJ (US); Robert C. Frye, Piscataway, NJ (US); Salvatore Levantino, Milan (IT)

(73) Assignee: Agere Systems, Inc., Allentown, PA (US)

( * ) Notice: Subject to any disclaimer, the term of this patent is extended or adjusted under 35 U.S.C. 154(b) by 53 days.

(21) Appl. No.: 10/631,531

(22) Filed: Jul. 31, 2003

(65) Prior Publication Data

US 2004/0066241 A1 Apr. 8, 2004

Related U.S. Application Data

(60) Provisional application No. 60/400,821, filed on Aug. 2, 2002.

(51) Int. Cl.$^7$ .............................. H03B 5/08; H03B 5/12
(52) U.S. Cl. ..................... 331/46; 331/48; 331/117 FE; 331/177 V
(58) Field of Search .............................. 331/45, 46, 48, 331/99, 100, 117 R, 117 FE, 117 D, 172, 177 V

(56) References Cited

U.S. PATENT DOCUMENTS 6,249,190 B1 * 6/2001 Rozenblit et al. ............. 331/46
6,469,585 B1 10/2002 Dai et al.
6,486,744 B1 11/2002 Cann

OTHER PUBLICATIONS

Crols and Steyaert, "A Fully Integrated 900MHz CMOS Double Quadrature Downconverter". ISSCC Digest of Technical Papers, pp. 136–137, San Fran, Feb. 1995.

Roufougaran et al., "A Single Chip 900MHz Spread Spectrum Wireless Transceiver in 1–um CMOS—Part 1: Architecture and Transmitter Design," IEEE J. of Solid–State Circuits, vol. 33, No. 4, pp. 515–534, Apr. 1998.

El Sayed and Elmasry, "Low–Phase–Noise LC Quadrature VCO Using Coupled Tank Resonators in a Ring Structure", IEEE J. of Solid–State Circuits, vol. 36, No. 4, pp. 701–705, Apr. 2001.

Van de Ven et al., "An optimally coupled 5GHz quadrature LC oscillator", 2001 Symposium on VLSI Circuits Digest of Technical Papers, pp. 115–118, Jun. 2001.

Vancorenland and Steyaert, "A 1.57 GHz Fully Integrated Very Low Phase Noise Quadrature VCO", 2001 Synposium on VLSI Circuits Digest of Technical Papers, pp. 111–114, Jun. 2001.

Andreani, P. "A Low Phase Noise Low Phase Error 1.8GHz Quadrature CMOS VCO", ISSCC Dig. of Technical Papers, pp. 290–291, San Fran, Feb. 2002.

Cabanillas, J. et al., "A 900 MHz Low Phase Noise CMOS Quadrature Oscillator", Proc. of 2002 IEEE Radio Frequency Integrated Circuits Symposium, pp. 63–66, Seattle, Jun. 2002.

Jacobsson, H. et al., "Very Low Phase Noise Fully Integrated Coupled VCOs", proc. of 2002 IEEE Radio Frequency Integrated Circuits Symposium, pp. 467–470, Seattle, Jun. 2002.

Hegazi, E. et al., "A Filtering Technique to Lower LC Oscillator Phase Noise", IEEE J. of Solid State Circuits, vol. 36, No. 12, pp. 1921–1930, Dec. 2001.

(Continued)

*Primary Examiner*—David Mis
(74) *Attorney, Agent, or Firm*—Duane Morris LLP

(57) ABSTRACT

A voltage controlled oscillator including a first oscillator circuit portion with at least one first inductor, and a second oscillator circuit portion with at least one second inductor, wherein the at least one first inductor and the at least one second inductor are electromagnetically coupled to each other.

8 Claims, 12 Drawing Sheets-

OTHER PUBLICATIONS

Ratagh and Lee, "Superharmonic Injection–Locked Frequency Dividers", IEEE J. of Solid State Circuits, vol. 34, No. 6, pp. 813–821, Jun. 1999.

Banai and Farzaneh, "Locked and unlocked behaviour of mutally coupled microwave oscillators", IEEE Proc of Microwaves, Antennas and Propagation, vol. 147, pp. 13–18, Feb. 2000.

Chang, H. et al., "Phase Noise in Coupled Oscillators: Theory and Experiment", IEEE Trans. on Microwave Theory and Techniques, vol. 45, No. 5, May 1997.

van der Wel, A.P., et al, "Measurement of MOSFET LF Noise Under Large Signal RF Excitation", Proc. of 2002 European Solid State Device Research Conf., pp. 91–94, Florence, Italy, Sep. 24–27, 2002.

Danesh and Long, "Differentially Drive Symmetric Microstrip Inductors", IEEE Trans. on Microwave Theory and Tech., vol. 50, No. 1, pp. 332–340, Jan. 2002.

Kinget, P. "Integrated GHz Voltage Controlled Oscillators", in Analog Circuit Design: (X)DSL and Other Communication Systems; RF MOST Models; Integrated Filters and Oscillators, pp. 353–381, Boston, MA 1999.

Andreani, P. et al., "Analysis and Design of a 1.8 GHz CMOS LC Quadrature VCO", IEEE J. of Solid State Circuits, vol. 37, No. 12, Dec. 2002.

Tiebout, M., "Low Power Low Phase Noise Differentially Tuned Quadrature VCO Design in Standard CMOS", IEEE J. of Solid State Circuits, vol. 36, pp. 1018–1024, Jul. 2001.

Klumperink, E. et al., "Reducing MOSFET 1/f Noise and Power Consumption by Switched Biasing", IEEE J. of Solid State Circuits, vol. 35, No. 7, pp 994–1001, Jul. 2000.

Rael and Abidi, "Physical Processes of Phase Noise in Differential LC Oscillators", IEEE 2000 Custom Integrated Circuits Conference, pp. 569–572.

van der Tang, J. et l., "Analysis and Design of an Optimally Coupled 5 GHz Quadrature LC Oscillator", IEEE J. of Solid State Circuits, vol. 37, No. 5, pp. 657–661, May 2002.

* cited by examiner

QUADRATURE VOLTAGE CONTROLLED OSCILLATOR UTILIZING COMMON-MODE INDUCTIVE COUPLING

CROSS REFERENCE TO RELATED APPLICATION

This application claims the benefit of provisional application No. 60/400,821, filed Aug. 2, 2002.

FIELD OF THE INVENTION

This present invention relates to voltage controlled oscillators, and in particular, a voltage controlled oscillator which utilizes common-mode inductive coupling to generate quadrature output signals.

BACKGROUND OF THE INVENTION

Wireless communication needs worldwide have increased dramatically in the last few years, particularly in the amount of devices being used and the demand for higher data rates. The amount of available radiofrequency (RF) spectrum is limited, and the result has been an incredible increase in the licensing costs for specific frequency bands. The limited frequency spectrum has prompted telecommunication equipment manufacturers to either increase the spectral efficiency by using more complex modulation schemes or to utilize available bandwidth at higher RF frequencies.

The highest data rate that a RF communication system can handle is generally determined by the type of modulation scheme used by the communication system. One of the most spectrally-efficient modulation schemes currently available is Quadrature Amplitude Modulation (QAM). In a QAM system, there are two carrier waves, each having the same frequency, but differing phase by ninety degrees (90°). One of the carrier waves is termed the "I" or "In-Phase" signal, and the other is termed the "Q" or "Quadrature-Phase" signal. The I and Q carrier waves are typically (re)generated by a voltage controlled oscillator (VCO) circuit. The use of QAM as a modulation scheme permits significantly more information to be carried by a particular bandwidth than modulation schemes such as Amplitude Modulation (AM) and Phase Modulation (PM).

There are many parameters in a RF system that can limit the order of QAM used. One of the main parameters is phase noise. A high proportion of phase noise is generated by local oscillators (LOs) used in frequency conversion in a RF system. Many local oscillators use a VCO within a phase locked loop (PLL) to generate a highly stable local oscillation with low phase noise.

The phase noise in a VCO output can result in cross-talk and increased bit error rates in both wired and wireless communications system. Recently, as switching speeds of Complementary Metal Oxide Semiconductor (CMOS) processes have increased, the design of VCOs in CMOS is attractive because manufacturing is less expensive and designing the VCO in CMOS allows greater integration with other CMOS digital circuitry.

The full integration of transceivers on chips implies the use of low intermediate frequency (IF) or zero IF architectures that require quadrature signals for In-phase/Quadrature-phase (I/Q) modulation and demodulation and image rejection.

Several techniques exist to generate the "quadrature" I and Q signals required for QAM. For example, a VCO running at the "double" frequency can be divided by two to give quadrature. This solution shows poor quadrature accuracy, as it requires an accurate 50% duty cycle VCO. A VCO followed by a polyphase filter gives quadrature, however, it requires buffers that increase the power consumption considerably. Alternatively, two separate VCOs can be forced to run in quadrature by using coupling transistors. However, this approach suffers from a trade-off between accurate quadrature and low phase noise. Moreover, the coupling transistors increase the power consumption. To circumvent the phase noise penalty, additional 90° phase shifters can be placed at the gates of the coupling transistors. However, the increase in power consumption remains.

Recently, an alternative quadrature topology has been proposed, where negative resistance transistors are cascoded by the coupling transistors. Andreani, P., "A Low-Phase-Noise Low-Phase-Error 1.8 GHz Quadrature CMOS VCO", ISSCC *Dig. of Tech. Papers*, pp. 290–291, February 2002. Although this approach gives low phase noise and does not increase power consumption, the technique is not well suited for implementation of widely tunable oscillators in the 5 GHz range. This is because the coupling transistors have to be about five (5) times larger than the negative resistance transistors, thus loading the oscillator with large parasitic capacitors that limit the tuning range.

To summarize, the solutions that presently exist for generating quadrature suffer from an increase in phase noise and/or an increase in power consumption, or they result in a limited tuning range, when used at high frequencies of oscillation.

Thus, there is presently a need for a VCO that generates quadrature over a wide tuning range without suffering from an increase in power consumption and phase noise.

SUMMARY OF THE INVENTION

The present invention comprises a voltage controlled oscillator including a first oscillator circuit portion with at least one first inductor, and a second oscillator circuit portion with at least one second inductor, wherein the at least one first inductor and the at least one second inductor are electromagnetically coupled to each other. In particular, to generate a quadrature (90 degrees) phase difference between the output signals of the two oscillator portions, the inductance values of the at least one first inductor and the at least one second inductor and the value of the electromagnetic coupling factor between the at least one first inductor and the at least one second inductor can be chosen such that the at least one first inductor and the at least one second inductor resonate with a (parasitic) capacitance at a frequency equal to the second harmonic of the frequency of oscillation of the two oscillator circuit portions, such that the second harmonics of the two oscillator circuit portions are in anti-phase.

DETAILED DESCRIPTION

The present invention comprises a fully integrated 5 GigaHertz (GHz) quadrature Complementary Metal Oxide Semiconductor (CMOS) Voltage Controlled Oscillator (VCO) that uses a new technique to generate quadrature over a wide tuning range without suffering from an increase in power consumption and phase noise. The technique uses injection-locking through common-mode inductive coupling to enforce a quadrature relation between two oscillators. The proposed VCO is implemented in a 0.25-$\mu$m CMOS process.

In principle, two differential oscillators can oscillate in quadrature at frequency $f_{OSC}$ by letting a coupling network enforce an anti-phase relationship between the second-order harmonics at frequency $2 \cdot f_{OSC}$. The following provides a detailed analysis of this principle by first looking at a single differential oscillator.

Figure 1:
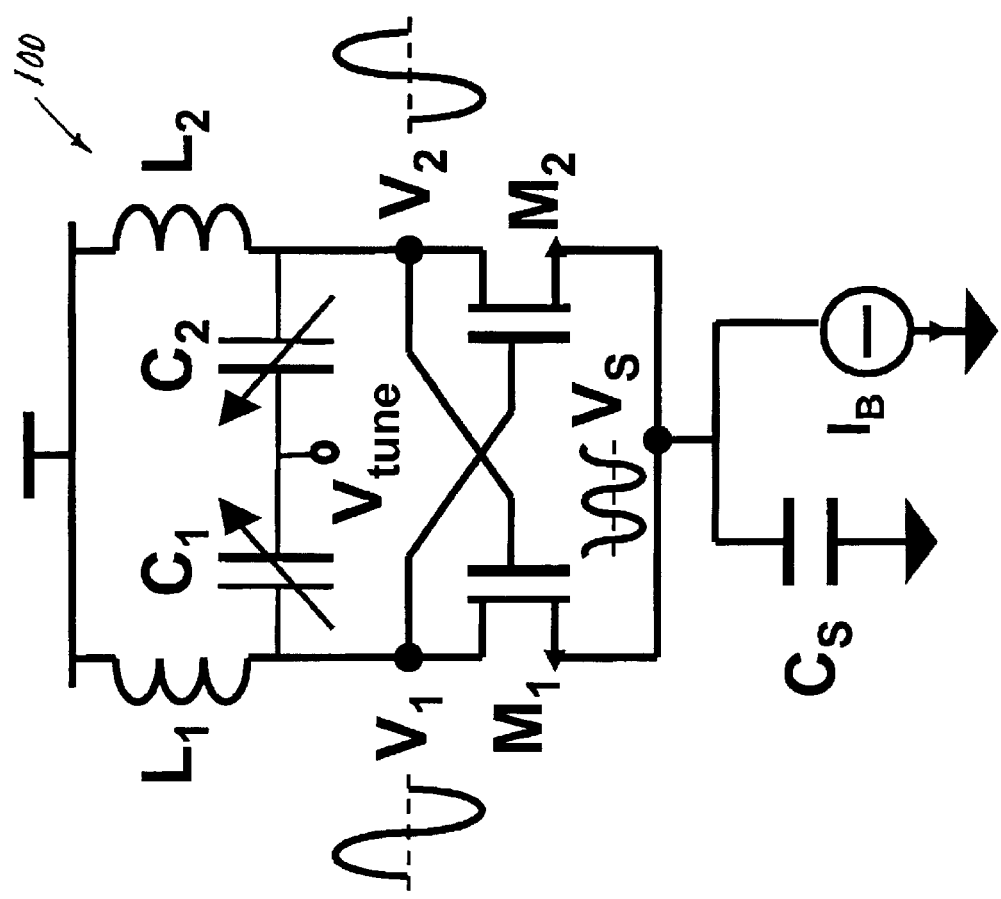
FIG. 1 is a schematic diagram showing a conventional voltage controlled differential CMOS oscillator circuit.

FIG. 1 shows a conventional voltage controlled differential CMOS oscillator circuit (100). It includes inductors $L_1$ and $L_2$, and transistors $M_1$ and $M_2$. It also includes two varactors (variable capacitance capacitors) $C_1$ and $C_2$. The capacitor $C_S$ represents the total parasitic capacitance that is present at node $V_S$. The current source $I_B$ supplies the bias current. In the oscillator shown in FIG. 1, the common-source signal $V_S$ clamps the output waveforms $V_1$ and $V_2$ at large values of the bias current $I_B$, and the oscillator enters the voltage-limited regime. This clamping occurs since the drain voltages $V_1$ of transistor $M_1$ and $V_2$ of transistor $M_2$ cannot be lower than the transistors' source voltage $V_S$, as this would reverse the current flow in the transistors.

Figure 2:
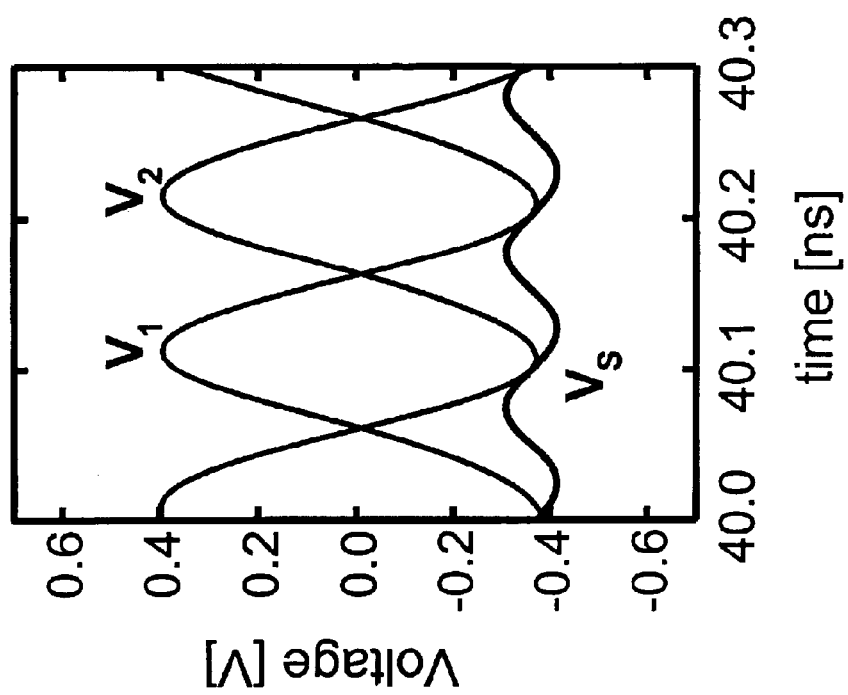
FIG. 2 is a graph showing the waveforms generated by the voltage controlled oscillator circuit shown in FIG. 1.

FIG. 2 shows the simulated waveforms of the oscillator in FIG. 1. It shows that the common-source voltage of the transistors ($V_S$) oscillates at a frequency equal to twice the oscillation frequency $f_{OSC}$. This oscillation, which originates from the rectifying action of the two MOS transistors $M_1$ and $M_2$, is not aligned optimally with the output waveforms $V_1$ and $V_2$. The misalignment is caused by the time delay given by the resistance of either transistor $M_1$ and $M_2$, operating in the triode region, and the capacitance $C_S$. It results in a strong clamping of the output waveforms $V_1$ and $V_2$.

Figure 3:
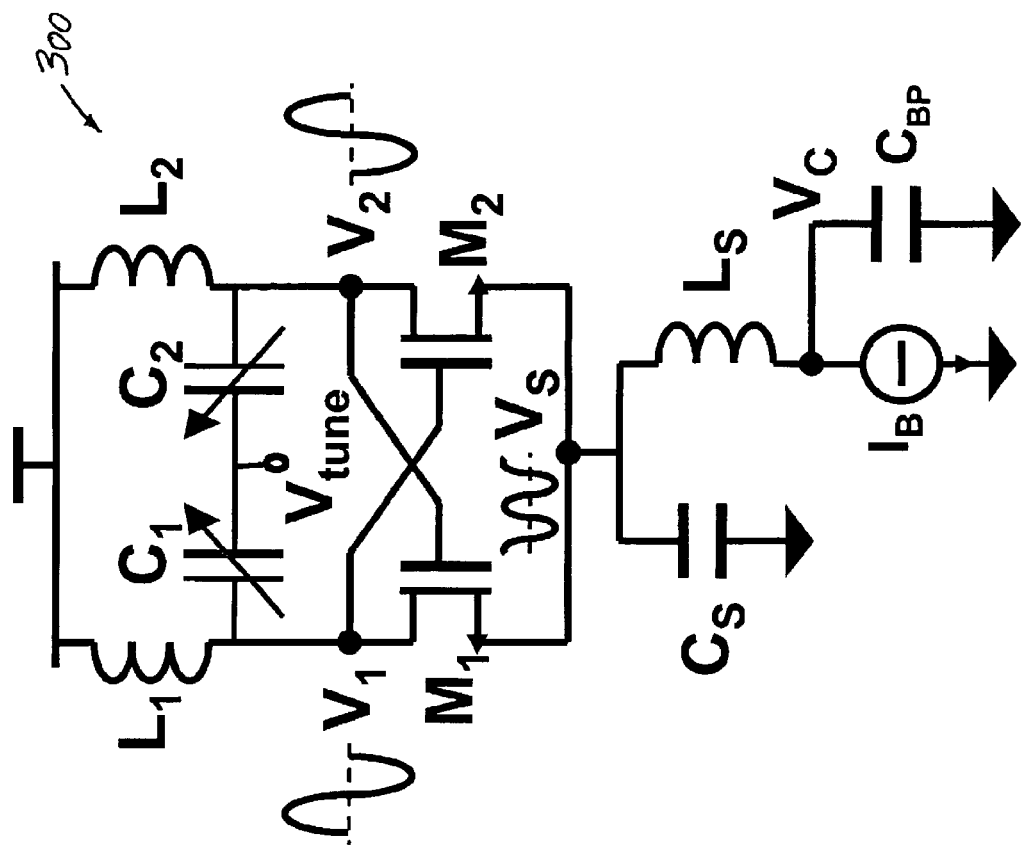
FIG. 3 is a schematic diagram showing a voltage controlled oscillator circuit with an LC (inductor-capacitor) circuit, resonant at twice the oscillation frequency attached at the common source point $V_S$.

Instead, if the network at the common-source node $V_S$ is designed to resonate at a frequency equal to twice the oscillation frequency, the impedance is real at that frequency so that the minima of the waveform $V_S$ align with the minima of the output waveforms $V_1$ and $V_2$. In the circuit of FIG. 3, this is accomplished by adding the inductor $L_S$, which is made to resonate with capacitor $C_S$ at a frequency equal to twice the oscillation frequency. Capacitor $C_{BP}$ is added to bypass the current source $I_B$ at these frequencies.

Figure 4:
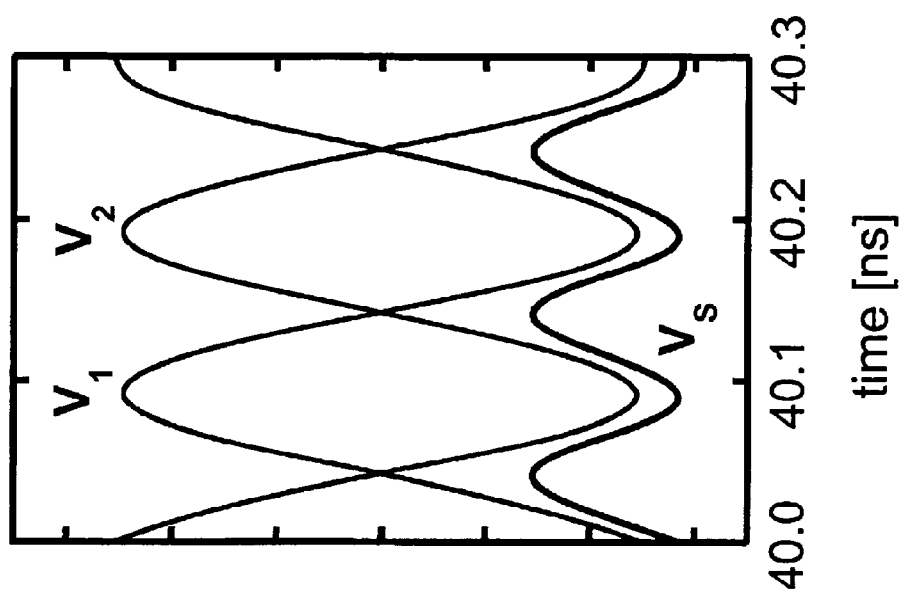
FIG. 4 is a graph showing the waveforms generated by the voltage controlled oscillator circuit shown in FIG. 3.

FIG. 4 shows the simulated waveforms of the circuit (300) of FIG. 3. Since now the output waveforms $V_1$ and $V_2$ are no longer clamped by $V_S$, they can reach higher amplitudes. In fact, the oscillator will now operate in the current limited regime.

Two oscillators like the one of FIG. 3 (300) can be coupled by removing the bypass capacitor $C_{BP}$ and connecting the respective nodes (C). A first exemplary embodiment of the present invention is depicted in the circuit (500) in FIG. 5. The VCO circuit generally includes a first oscillator circuit portion A and a second oscillator portion B. The oscillator circuit portions A, B have common-mode $2^{nd}$-order harmonics that are coupled by the inductor pair $L_{S1}$, $L_{S2}$. The inductance values of inductors $L_{S1}$ and $L_{S2}$ are chosen such that they resonate with the (parasitic) capacitances $C_{S1}$ and $C_{S2}$ at a frequency equal to the second harmonic of the frequency of oscillation of the oscillator portions A and B.

The first oscillator circuit portion A includes inductors $L_1$ and $L_2$, and transistors $M_1$ and $M_2$. The first oscillator circuit portion A also includes two varactors (variable capacitance capacitors) $C_1$ and $C_2$. Similarly, the second oscillator circuit portion B includes inductors $L_3$ and $L_4$, transistors $M_3$ and $M_4$, and varactors $C_3$, $C_4$.

Figure 5:
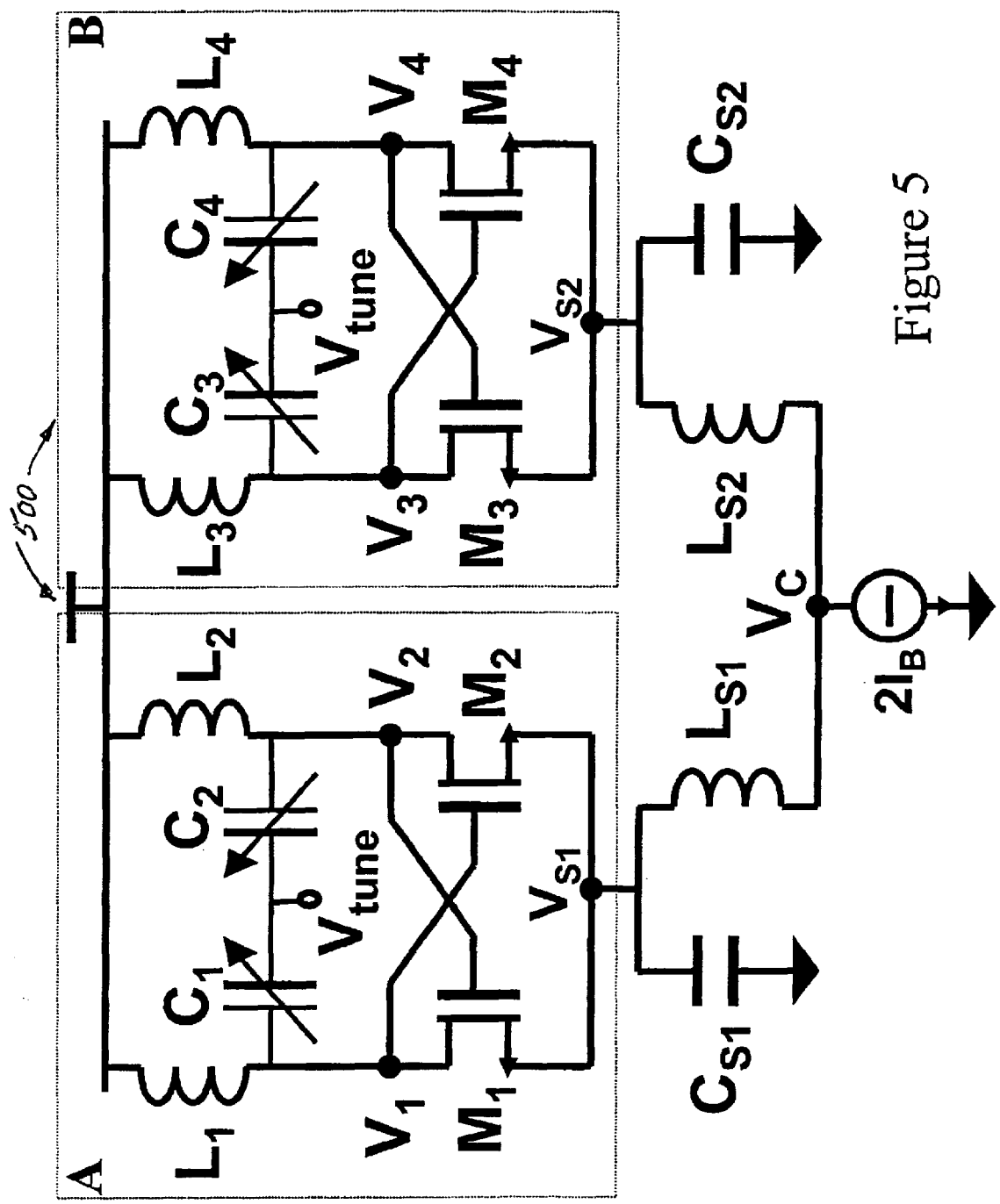
FIG. 5 is a schematic diagram showing a voltage controlled oscillator circuit according to a first exemplary embodiment of the present invention.

It can be shown that the circuit of FIG. 5 has two oscillation modes: the outputs $V_{1-4}$ may run either in quadrature or in phase.

The impedance of the tail network between the nodes (S1)–(S2) and ground depends on the relative phase between the waveforms $V_{S1}$ and $V_{S2}$. If these voltages run in anti-phase, (C) is a balanced node and each of the two oscillators behaves like the oscillator of FIG. 3. With the second-order harmonics $V_{S1}$ and $V_{S2}$ being in anti-phase, the output waveforms of the two oscillators must be in quadrature. We will refer to this mode as the odd mode. Instead, if $V_{S1}$ and $V_{S2}$ are in-phase, no ac-current flows in the tail inductors $L_{S1}$ and $L_{S2}$, provided that node (C) has a high impedance to ground even at high frequencies, and each of the two oscillators behaves like the one in FIG. 1. This implies that the outputs $V_1$ and $V_3$ oscillate either in-phase or in anti-phase. We will refer to this mode as the even mode.

Since we are interested in generating oscillations in quadrature, we need to select the odd mode. This automatically happens if the coupled oscillators are driven at high values of bias current $I_B$. Under the condition of high bias current $I_B$, the even-mode equivalent circuit in FIG. 1 works in the voltage limited regime, while the odd-mode equivalent circuit in FIG. 3 works in current limited regime. Therefore, the output amplitude of the circuit in FIG. 5 in the even-mode of operation is lower than in the odd-mode of operation. The loop non-linearity selects the mode with higher oscillation amplitude. In fact, simulations will show that only the odd mode prevails, which is the desired mode of operation, as it gives quadrature output signals.

Figure 6:
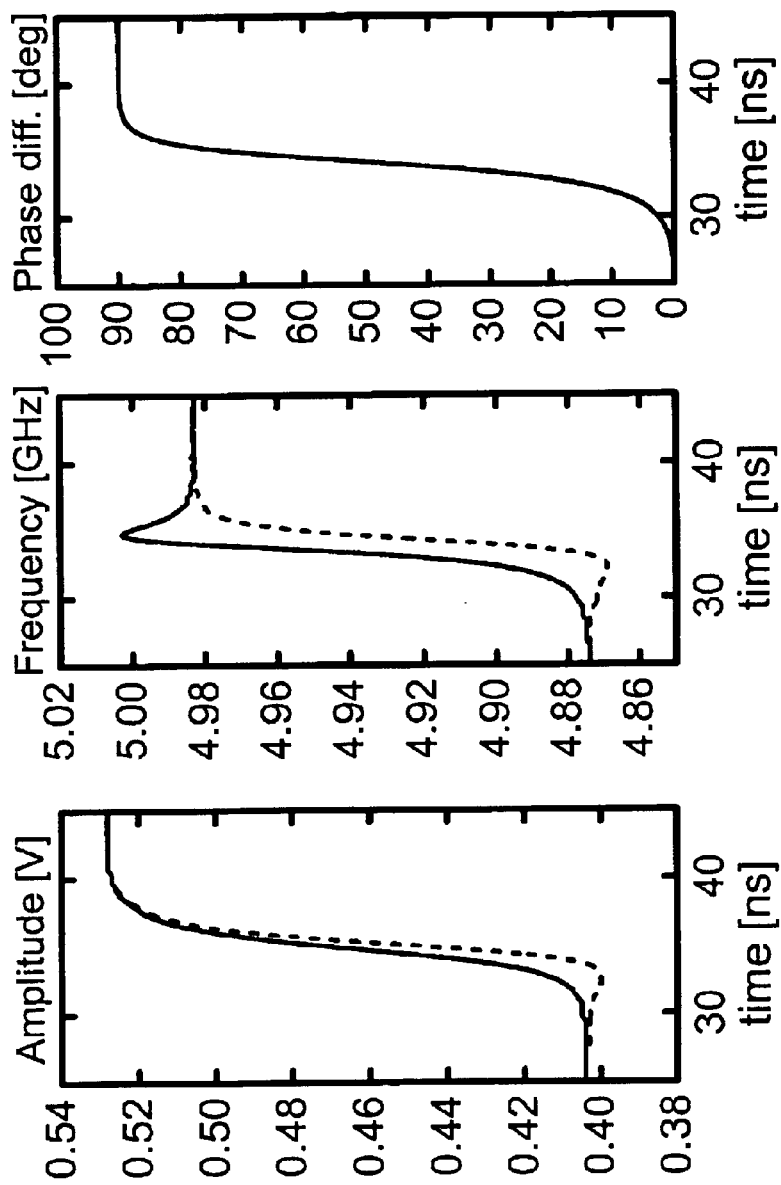
FIG. 6 is a graph showing the simulated transient start-up behavior of the voltage controlled oscillator circuit shown in FIG. 5.

FIG. 6 depicts the initial transient waveforms occurring in the coupled oscillator portions A and B of FIG. 5 when they are forced to start in phase. The plots show the amplitude, the oscillation frequency and the phase difference between the two oscillator outputs $V_1$ and $V_3$ as a function of time.

As expected, at the beginning of the transient, the oscillation amplitude is identical to that of the circuit in FIG. 1 and the outputs run in phase. After the simulator's numerical inaccuracy creates a slight asymmetry, the phase difference between the outputs changes. At steady state, the amplitude of both oscillators reaches that of the circuit in FIG. 3 and the output waveforms run in quadrature. The final oscillation frequency is set only by the tank resonance and it is not altered by the coupling.

Figure 7:
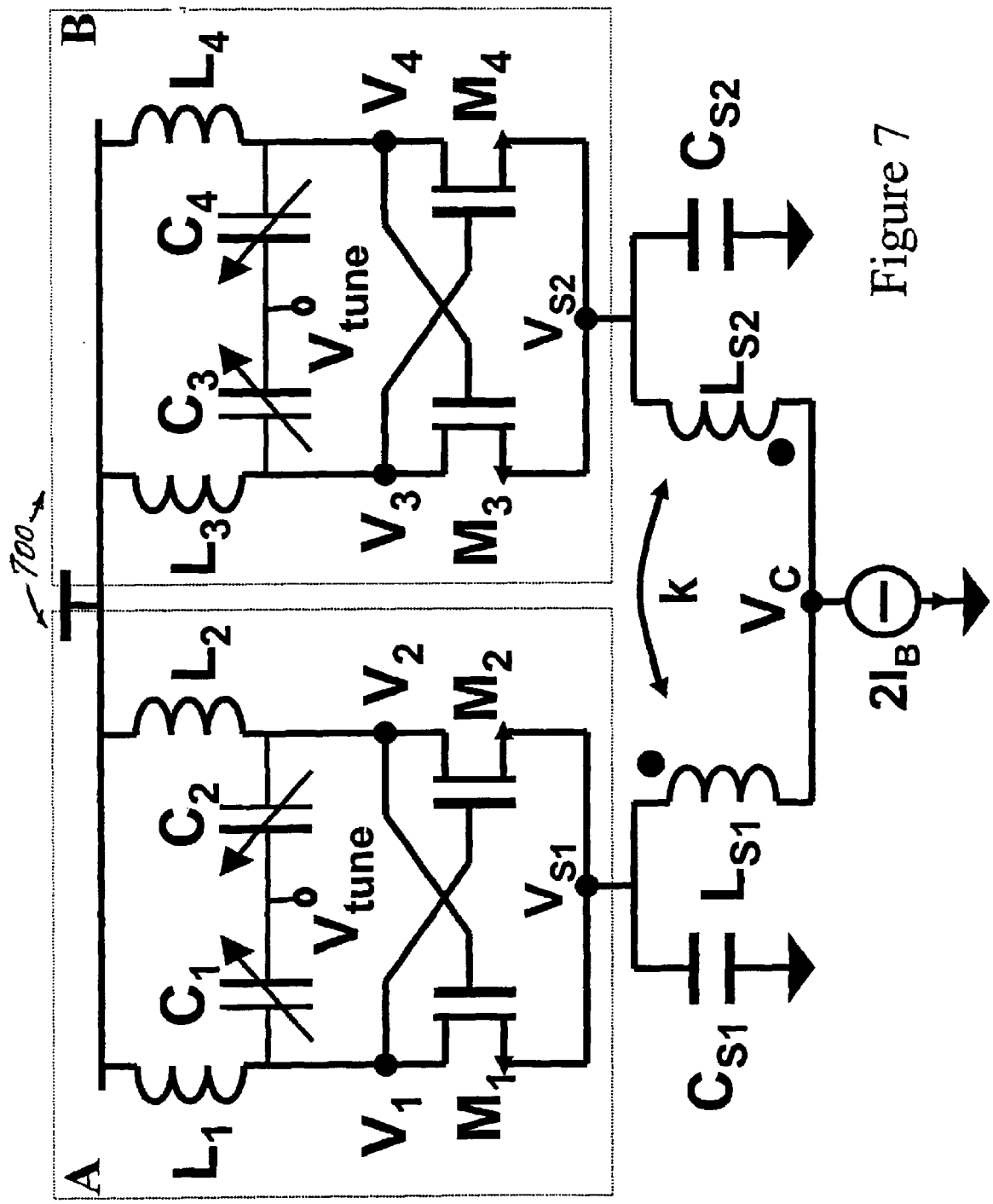
FIG. 7 is a schematic diagram showing a voltage controlled oscillator circuit according to a second exemplary embodiment of the present invention.

To further ensure the circuit's preference for the odd mode (which gives the desired quadrature signals) the inductors $L_{S1}$ and $L_{S2}$ in FIG. 5 can be electromagnetically coupled in anti-phase. FIG. 7 shows the electromagnetic coupling of inductors $L_{S1}$ and $L_{S2}$ in a second exemplary embodiment of the present invention. The factor k denotes the electromagnetic coupling factor. The dots near inductors $L_{S1}$ and $L_{S2}$ indicate the sign of the electromagnetic coupling. Similar to the circuit (500) in FIG. 5, the inductor values $L_{S1}$ and $L_{S2}$ and the value of the coupling factor k are chosen such that the common-source voltages $V_{S1}$ and $V_{S2}$ resonate in anti-phase at a frequency equal to twice the oscillation frequency, such that the output signals $V_{1-4}$ are in quadrature.

Figure 8:
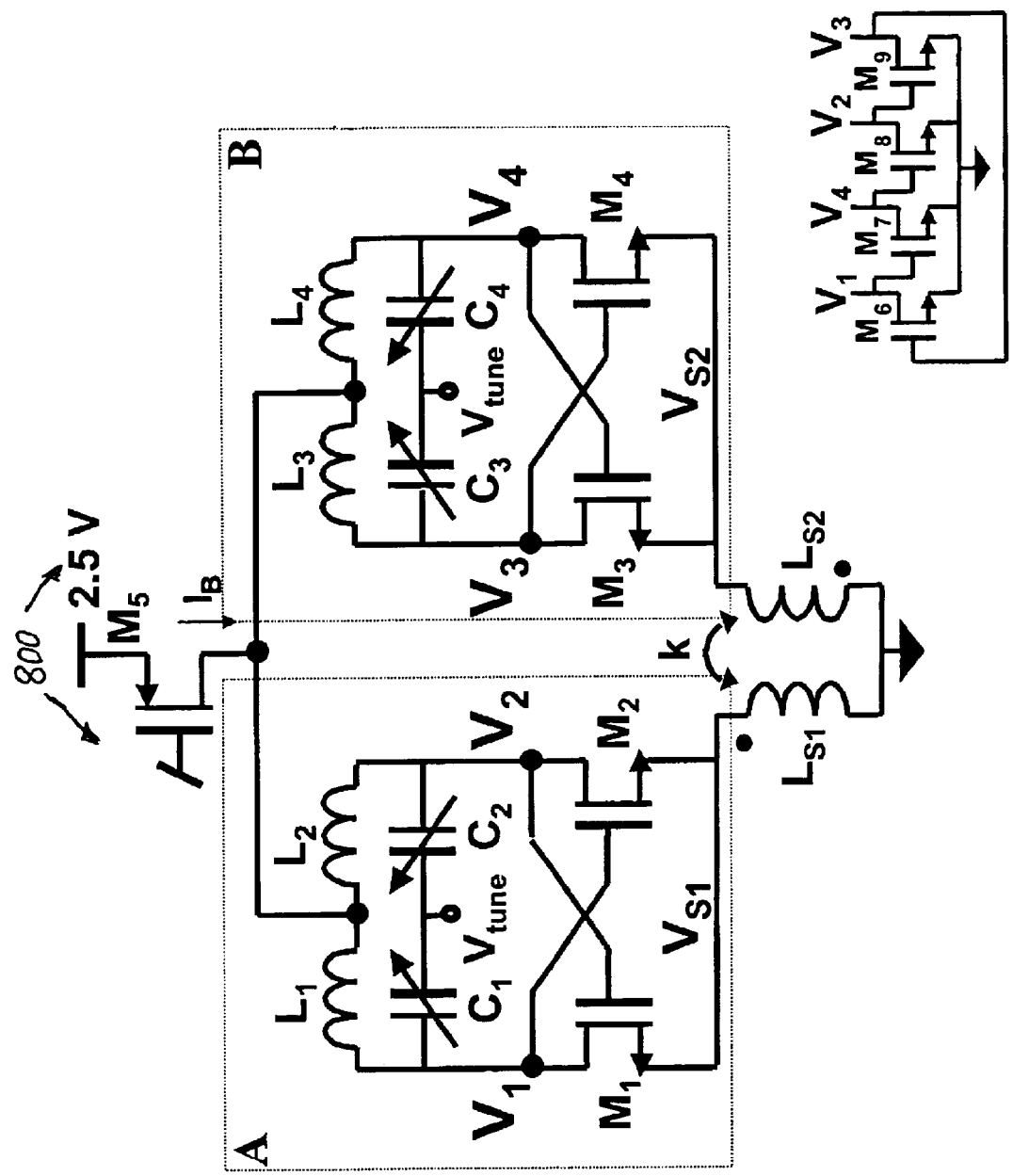
FIG. 8 is a schematic diagram showing a voltage controlled oscillator circuit according to a third exemplary embodiment of the present invention.

FIG. 8 shows a third exemplary embodiment of the present invention. This circuit (800) differs from the one in FIG. 7 by the way the bias current $I_B$ is supplied to the oscillator portions A and B. In this embodiment the bias current $I_B$ is supplied at the top of the circuit (800) by transistor $M_5$. The parasitic capacitors $C_{S1}$ and $C_{S2}$ are not drawn in this Figure. The bottom-side of the inductors $L_{S1}$ and $L_{S2}$ are now tied directly to ground. Similar to the circuit (700) in FIG. 7, the inductor values $L_{S1}$ and $L_{S2}$ and the value of the coupling factor k are chosen such that the common-source voltages $V_{S1}$ and $V_{S2}$ resonate in anti-phase at a frequency equal to twice the oscillation frequency, such that the output signals $V_{1-4}$ are in quadrature. Transistors $M_6$-$M_9$ in FIG. 8 are minimum-size devices that are added to give directivity to the quadrature phases. Without them, the oscillator would have no preference for either +90° or −90° phase difference. The current flowing through $M_6$-$M_9$ is negligible compared to the current in the transistors $M_1$-$M_4$, as their (W/L) ratio is less than 1% of that of $M_1$-$M_4$.

Figure 9:
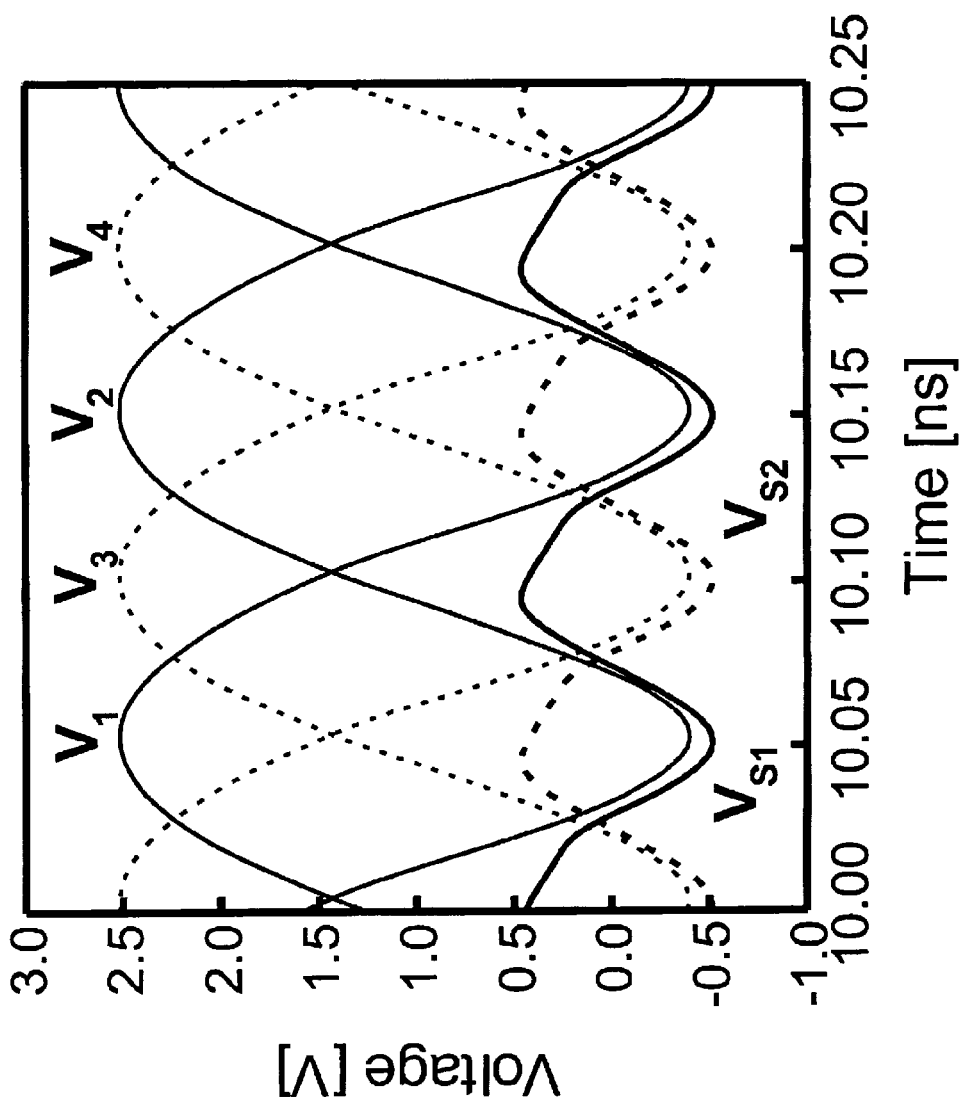
FIG. 9 is a graph showing the simulated steady-state transient waveforms of the voltage controlled oscillator circuit shown in FIG. 8.

FIG. 9 shows the simulated output waveforms of the circuit in FIG. 8, along with the common-source voltages $V_{S1}$ and $V_{S2}$. Note that the output waveforms are in quadrature, while the second-order harmonic common-mode signals $V_{S1}$ and $V_{S2}$ are in anti-phase.

Figure 10:
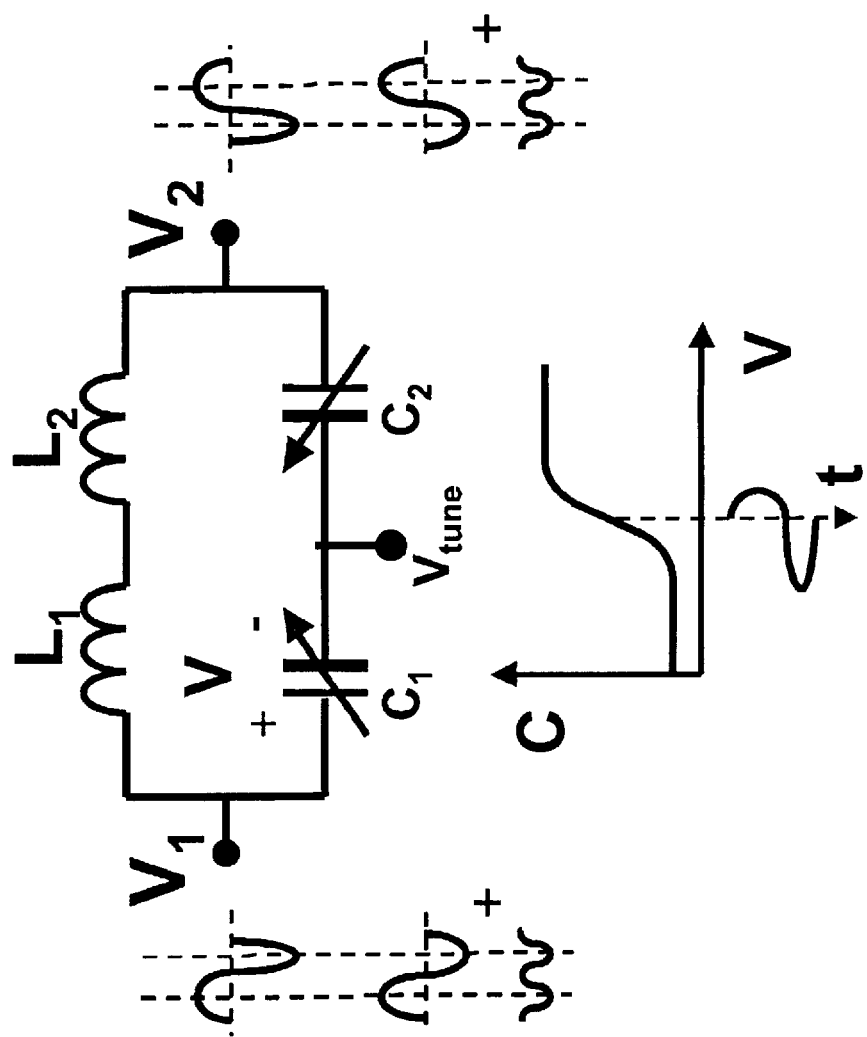
FIG. 10 is a graph showing the LC (inductor-capacitor) tank used in each of the two portions of the oscillators of FIGS. 5, 7 and 8, along with the capacitance versus voltage curve of the variable capacitance capacitor (varactor) $C_{1,2}$.

Apart from transistors $M_1$-$M_4$ also the varactors $C_{14}$ contribute to the second-order harmonic oscillation at the common nodes ($S_1$) and ($S_2$). The varactors chosen in the embodiment of FIG. 8 are accumulation/depletion PMOS devices: they exhibit a step-like C(V)-curve with maximum capacitance at high gate-to-well voltages. FIG. 10 shows the C(V) curve of the varactor, along with a single-ended output waveform of the oscillator, that is distorted by the varactor. When the single-ended waveform that drives the gate of the varactor is high, the associated varactor capacitance is high and the oscillation waveform "slows down" and flattens. When the voltage is low, the capacitance is low and the waveform "speeds up" and sharpens. This gives rise to a second-order harmonic that shows up as a common-mode signal. Like the second-order harmonic due to transistors $M_1$-$M_4$, the maxima of this second-order harmonic align in-phase with the zero crossings of the fundamental harmonic, as shown in FIG. 10. Thus, the output waveform distortion introduced by the varactors effectively adds to the quadrature coupling.

In the following, the fundamental differences between ring-based quadrature VCOs and the inductive coupling scheme according to the exemplary embodiments of the present invention are discussed.

In quadrature inductor-capacitor (LC) oscillators based on a ring structure, the frequency of oscillation ($f_{OSC}$) is not necessarily coincident with the resonance frequency of the individual LC-tanks. The Barkhausen criterion applied to a conventional four-stage ring oscillator implies that the phase shift across each stage of the ring is 90°. However, the maximum phase shift between voltage and current that a resonator can provide is ±90°; this condition only occurs at frequencies where the impedance drops to zero and the phase diagram is flat. Therefore, phase shifters must be included in the loop.

In the conventional LC quadrature oscillator topology consisting of two coupled oscillators, a 45° phase shift per stage is obtained by summing two quadrature signals. Another 180° phase shift is obtained by a simple sign-inversion. As a result, the oscillation frequency is forced to deviate from the tank resonance frequency, enabling each resonator to provide 45° of phase shift. However, the tank is now no longer operating at the frequency where the impedance is maximum and the phase characteristic is steepest. Consequently, the oscillation amplitude and the phase stability are reduced and the phase noise increases.

This problem has been addressed in other conventional VCOs by applying additional phase shift, such that the tanks operate at zero phase shift (i.e., at their resonance frequency). However, the additional phase shifters increase power consumption and design complexity, and can potentially introduce extra noise.

In the VCO circuit (500), (700), and (800), according to the exemplary embodiments of the present invention (see FIGS. 5, 7 and 8), two oscillator circuit portions A, B are coupled through reciprocal injection locking. This mechanism only enforces the quadrature phase relation between the two oscillator circuit portions and does not require the oscillation frequency to deviate from the tank resonance. Consequently, the coupling does not reduce the phase stability of each individual oscillator and no phase noise increase is realized. Moreover, since the quadrature coupling is established by means of coupled inductors rather than by transistors, the coupling devices introduce no significant extra sources of noise.

The coupling inductors $L_{S1}$ and $L_{S2}$ have additional beneficial effects on phase noise, while not increasing the power consumption. They allow the oscillation waveforms to reach values below the negative supply rail (See FIG. 9). Thus, the oscillation amplitude is maximized and the $1/f^2$-phase noise is reduced. In addition, the coupling inductors $L_{S1}$ and $L_{S2}$ enable the gate-source voltage ($V_{GS}$) and the drain-source voltage ($V_{DS}$) of $M_{1-4}$ to periodically reach zero-value. This helps to reduce their contribution to $1/f^3$ phase noise.

Injection locking techniques are often considered not reliable enough. They feature a limited frequency capture range that is difficult to predict in practical cases. However, in the exemplary embodiments of the present invention, a sufficient capture range is only required to overcome potential mismatches between the two tanks (e.g., first and second oscillator circuit portions A, B).

The quadrature VCO circuit may be realized through a 0.25-$\mu$m CMOS process. The inductors $L_{1-4}$ and $L_{S1,S2}$ may be laid out in the three top metal layers of a five Al-metal layer process. An electromagnetic simulator (e.g., IES[3]) may be used to model all inductors.

Figure 11:
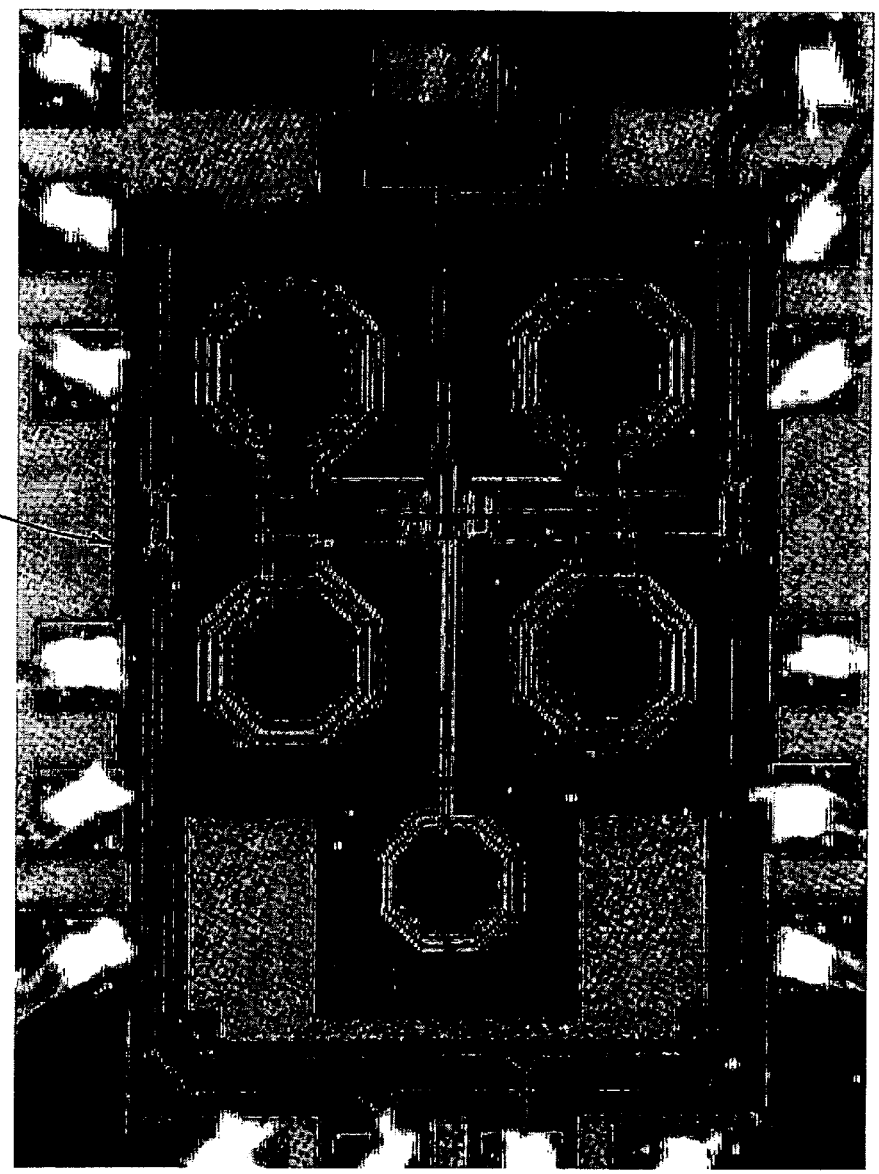
FIG. 11 shows voltage controlled oscillator circuit of FIG. 8 implemented using CMOS.

FIG. 11 shows a photograph of the VCO circuit (800) shown in FIG. 8 as fabricated in CMOS. The four inductors $L_{1-4}$ of the first and second oscillator circuit portions A, B are in the center of the figure. These inductors have a simulated inductance of 1.8 nH and a quality factor of 9 at 5 GHz. The coupled inductors $L_{S1,S2}$ are laid out as a center tapped symmetrical inductor (See left-hand side of FIG. 11). This inductor ($L_{S1,S2}$) is intentionally placed relatively further from the core, to minimize parasitic coupling to the other inductors ($L_{1-4}$). The two coupled inductors $L_{S1,S2}$ have a simulated inductance of 0.62 nH each and a coupling coefficient k of 0.55 at 10 GHz.

Figure 12:
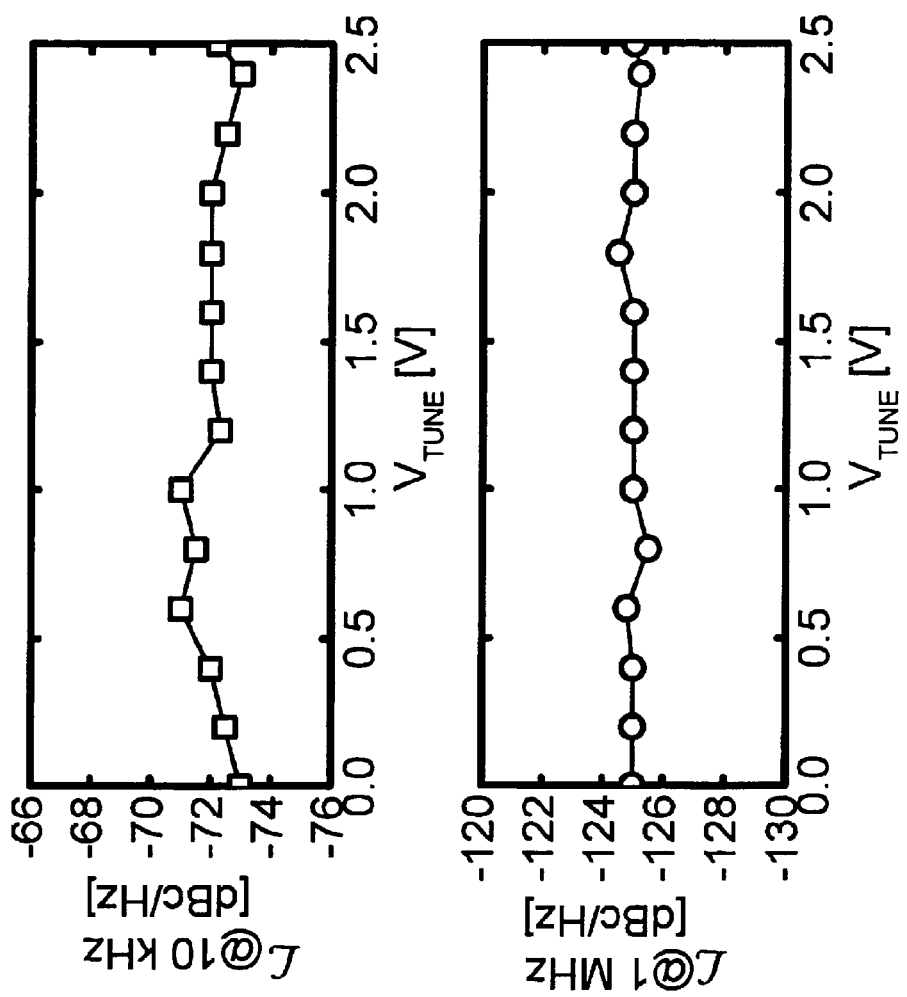
FIG. 12 is a graph showing the measured phase noise versus tuning voltage for the voltage controlled oscillator of FIG. 8.

FIG. 12 shows the measured phase noise along the entire tuning range, for offset frequencies of 10 kHz (flicker-noise dominated) and 1 MHz (white-noise dominated). Both the $1/f^3$- and $1/f^2$-phase noise are remarkably constant over the tuning range, which ranges from 4.6–5.2 GHz. The worst-case noise levels are −71 dBc/Hz at 10 kHz and −124.5 dBc/Hz at 1 MHz.

Table 1 shows a comparison of the achieved figure of merit (FOM) for the VCO circuit according to the exemplary embodiment of the present invention to that of other conventional quadrature oscillators. All FOMs are calculated from the worst-case phase noise.

TABLE I

| Quadrature Oscillators | Frequency of Oscillation fosc (GHz) | Power P [mW] | Figure of Merit FOM |
|---|---|---|---|
| Conventional 1 | 1.88–1.98 | 27 | 178 |
| Conventional 2 | 4.91–5.23 | 21 | 168 |
| Conventional 3 | 1.36–1.66 | 30 | 181 |
| Conventional 4 | 1.77–1.99 | 20 | 185 |
| Conventional 5 | 1.64–1.97 | 50 | 178 |
| Present Invention | 4.60–5.20 | 22 | 185 |

A new quadrature-coupling VCO has been introduced. In the proposed scheme, two oscillator circuit portions (e.g., A, B in FIGS. 5, 7 and 8) are injection-locked in quadrature by means of common-mode inductive coupling of the common-mode second-order harmonics. This gives quadrature over a wide tuning range, without introducing any phase noise or power consumption increase. The advantages over conventional ring-based quadrature oscillators have been discussed above. A 0.25 μm-CMOS 5 GHz quadrature VCO provides an exemplary embodiment of the present invention, featuring a phase noise lower than −124 dBc/Hz at 1 MHz offset over the 4.6–5.2 GHz tuning range at 22 mW power consumption.

Although the invention has been described in terms of exemplary embodiments, it is not limited thereto. Rather, the appended claims should be construed broadly to include other variants and embodiments of the invention which may be made by those skilled in the art without departing from the scope and range of equivalents of the invention.

What is claimed is:

1. A quadrature oscillator comprising:

an oscillator circuit having a first oscillator and a second oscillator driven by a source of input bias current; and a resonant circuit coupling the first and second oscillators, wherein said resonant circuit comprises, parasitic capacitances of the first oscillator and the second oscillator being coupled with inductors to resonate at a second harmonic of an output frequency of the oscillator circuit, and wherein the first and second oscillators oscillate at their respective second-order harmonic frequencies with a phase difference therebetween to operate in a current limited mode.

2. The quadrature oscillator of claim 1, wherein said inductors comprise; a first inductor coupled with a parasitic capacitance of the first oscillator for resonance therewith, and a second inductor coupled with a parasitic capacitance of the second oscillator for resonance therewith.

3. The quadrature oscillator of claim 1, wherein the source of bias current is connected through the inductors to the first and second oscillators.

4. The quadrature oscillator of claim 1, wherein said inductors comprise; a first inductor coupling the source of bias current to the first oscillator, and a second inductor coupling the source of bias current to the second oscillator, and further wherein, the first inductor and the second inductor are electromagnetically coupled in anti-phase to the source of bias current.

5. The quadrature oscillator of claim 1, wherein the resonant circuit couples the source of bias current to the first and second oscillators.

6. The quadrature oscillator of claim 1, wherein the resonant circuit and the source of bias current are each coupled to the first and second oscillators.

7. The quadrature oscillator of claim 1, wherein the first and second oscillators are differential oscillators.

8. The quadrature oscillator of claim 1, wherein the resonant circuit adapts the first and second oscillators for use in a transceiver.

* * * * *